(12) United States Patent
Lee et al.

(10) Patent No.: US 9,246,135 B2
(45) Date of Patent: Jan. 26, 2016

(54) ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

(71) Applicant: Samsung Display Co., Ltd., Yongin, Gyeonggi-Do (KR)

(72) Inventors: Su-Hwan Lee, Yongin (KR); Un-Cheol Sung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 203 days.

(21) Appl. No.: 13/787,464

(22) Filed: Mar. 6, 2013

(65) Prior Publication Data

US 2014/0014917 A1   Jan. 16, 2014

(30) Foreign Application Priority Data

Jul. 10, 2012   (KR) .................. 10-2012-0075141

(51) Int. Cl.
| | | |
|---|---|---|
| *H01L 51/56* | (2006.01) | |
| *C23C 14/04* | (2006.01) | |
| *C23C 14/12* | (2006.01) | |
| *C23C 14/54* | (2006.01) | |

(Continued)

(52) U.S. Cl.
CPC .............. *H01L 51/56* (2013.01); *C23C 14/042* (2013.01); *C23C 14/12* (2013.01); *C23C 14/545* (2013.01); *H01L 51/001* (2013.01); *H01L 51/50* (2013.01)

(58) Field of Classification Search
CPC .......... H01L 51/001–51/0012; H01L 51/0002; H01L 51/0008; H01L 51/50; H01L 51/56; C23C 14/12; C23C 14/04–14/042; C23C 14/22–14/545
See application file for complete search history.

(56) References Cited

U.S. PATENT DOCUMENTS

| | | | |
|---|---|---|---|
| 7,964,037 B2 * | 6/2011 | Fukuda ................. | C23C 14/243 118/726 |
| 2002/0076847 A1 | 6/2002 | Yamada et al. | |
| 2003/0047817 A1* | 3/2003 | Kim ............................. | 257/797 |

(Continued)

FOREIGN PATENT DOCUMENTS

| | | |
|---|---|---|
| JP | 2002-175878 | 6/2002 |
| JP | 2003-157973 | 5/2003 |

(Continued)

OTHER PUBLICATIONS

Patent Abstracts of Japan, and English machine translation of Japanese Publication 2003-297562 dated Oct. 17, 2003, (21 pages).

*Primary Examiner* — Laura Menz
*Assistant Examiner* — Maliheh Malek
(74) *Attorney, Agent, or Firm* — Christie, Parker & Hale, LLP

(57) ABSTRACT

An organic layer deposition apparatus, a method of manufacturing an organic light-emitting display device by using the same, and an organic light-emitting display device manufactured using the method, and in particular, an organic layer deposition apparatus that is suitable for use in the mass production of a large substrate and enables high-definition patterning, a method of manufacturing an organic light-emitting display device by using the same, and an organic light-emitting display device manufactured using the method.

17 Claims, 13 Drawing Sheets

(51) Int. Cl.
*H01L 51/50* (2006.01)
*H01L 51/00* (2006.01)

(56) References Cited

U.S. PATENT DOCUMENTS

| | | | |
|---|---|---|---|
| 2003/0168013 A1* | 9/2003 | Freeman et al. | 118/726 |
| 2004/0007183 A1 | 1/2004 | Slyke et al. | |
| 2005/0011443 A1* | 1/2005 | Matsukaze | C23C 14/12 118/715 |
| 2005/0056798 A1* | 3/2005 | Kashiwaya | C09K 11/7733 250/580 |
| 2005/0211172 A1* | 9/2005 | Freeman et al. | 118/726 |
| 2006/0144335 A1* | 7/2006 | Lee | C23C 14/505 118/719 |
| 2007/0178708 A1* | 8/2007 | Ukigaya | 438/758 |
| 2008/0014825 A1* | 1/2008 | Fukuda | C23C 14/243 445/46 |
| 2008/0115729 A1 | 5/2008 | Oda et al. | |
| 2008/0118630 A1* | 5/2008 | Park | C23C 14/547 427/9 |
| 2008/0299496 A1* | 12/2008 | Hirakata et al. | 430/319 |
| 2009/0308316 A1* | 12/2009 | Park | C23C 14/12 118/719 |
| 2010/0038658 A1* | 2/2010 | Haglund, Jr. | C23C 14/12 257/98 |
| 2010/0187094 A1* | 7/2010 | Fukao | C23C 14/545 204/192.1 |
| 2010/0247807 A1* | 9/2010 | Nakayama | C23C 14/30 427/585 |
| 2010/0297349 A1* | 11/2010 | Lee et al. | 427/248.1 |
| 2010/0310768 A1* | 12/2010 | Lee et al. | 427/255.5 |
| 2010/0330712 A1* | 12/2010 | Lee et al. | 438/22 |
| 2011/0042659 A1* | 2/2011 | Kim et al. | 257/40 |
| 2011/0052791 A1* | 3/2011 | Jo et al. | 427/8 |
| 2011/0053301 A1* | 3/2011 | Kang et al. | 438/34 |
| 2011/0165320 A1* | 7/2011 | Choi et al. | 427/66 |
| 2011/0165327 A1* | 7/2011 | Park et al. | 427/248.1 |
| 2011/0186820 A1* | 8/2011 | Kim et al. | 257/40 |
| 2011/0189380 A1 | 8/2011 | Jang et al. | |
| 2011/0262625 A1* | 10/2011 | Park et al. | 427/66 |
| 2012/0006259 A1* | 1/2012 | Sung et al. | 118/213 |
| 2012/0068199 A1* | 3/2012 | Sung et al. | 257/88 |
| 2012/0068201 A1* | 3/2012 | Sung et al. | 257/88 |
| 2012/0114833 A1* | 5/2012 | Nakagawa | C23C 14/546 427/8 |
| 2012/0114837 A1* | 5/2012 | Nakagawa | C23C 14/24 427/9 |
| 2012/0114838 A1* | 5/2012 | Nakagawa | C23C 14/546 427/9 |
| 2012/0114839 A1* | 5/2012 | Fukuda | C23C 14/24 427/9 |
| 2012/0114840 A1* | 5/2012 | Fukuda | C23C 14/24 427/9 |
| 2012/0174865 A1 | 7/2012 | Choi et al. | |
| 2012/0183676 A1* | 7/2012 | Sonoda et al. | 427/8 |
| 2013/0115366 A1* | 5/2013 | Park | C23C 14/547 427/9 |
| 2013/0280840 A1* | 10/2013 | Sonoda et al. | 438/34 |
| 2013/0299810 A1* | 11/2013 | Sonoda et al. | 257/40 |
| 2014/0014921 A1* | 1/2014 | Choi | 257/40 |
| 2014/0014929 A1* | 1/2014 | Lee et al. | 257/40 |
| 2014/0065293 A1* | 3/2014 | Kim et al. | 427/8 |
| 2014/0170301 A1* | 6/2014 | Jo | C23C 14/24 427/9 |
| 2014/0205762 A1* | 7/2014 | Shiono | C23C 14/022 427/523 |
| 2014/0291619 A1* | 10/2014 | Lee et al. | 257/40 |
| 2014/0326962 A1* | 11/2014 | Lee et al. | 257/40 |
| 2014/0342481 A1* | 11/2014 | Lee et al. | 438/34 |
| 2014/0345527 A1* | 11/2014 | Sonoda et al. | 118/715 |
| 2014/0377890 A1* | 12/2014 | Voronov et al. | 438/16 |

FOREIGN PATENT DOCUMENTS

| | | |
|---|---|---|
| JP | 2003-297562 | 10/2003 |
| JP | 2004-91919 | 3/2004 |
| KR | 10-2006-0125116 A | 12/2006 |
| KR | 10-2011-0090121 A | 8/2011 |
| KR | 10-2012-0081811 A | 7/2012 |

* cited by examiner

ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS MANUFACTURED USING THE METHOD

CROSS-REFERENCE TO RELATED PATENT APPLICATION

This application claims priority to and the benefit of Korean Patent Application No. 10-2012-0075141, filed on Jul. 10, 2012, in the Korean Intellectual Property Office, the disclosure of which is incorporated herein in its entirety by reference.

BACKGROUND

1. Field

Aspects of the present invention relate to an organic layer deposition apparatus, a method of manufacturing an organic light-emitting display device by using the same, and an organic light-emitting display device manufactured using the method.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to a gravitational pull, thereby distorting its pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was already known to the inventors of the present invention before achieving the present invention or is technical information acquired in the process of achieving the present invention. Therefore, it may contain information that does not form the prior art that is already known in this country to a person of ordinary skill in the art.

SUMMARY

In order to address the drawback of the deposition method using a fine metal mask (FMM) and/or other issues, aspects of the present invention are directed toward organic layer deposition apparatuses that are suitable for use in the mass production of a large substrate and enable high-definition patterning, methods of manufacturing organic light-emitting display devices by using the same, and organic light-emitting display devices manufactured using the methods.

According to an embodiment of the present invention, there is provided an organic layer deposition apparatus including: a conveyer unit including a transfer unit for fixing a substrate and configured to move along with the substrate, a first conveyer unit for moving in a first direction the transfer unit on which the substrate is fixed, and a second conveyer unit for moving in a direction opposite to the first direction the transfer unit from which the substrate is separated after deposition has been completed; and a deposition unit including a chamber maintained in a vacuum state and an organic layer deposition assembly depositing an organic layer on the substrate fixed on the transfer unit, wherein the organic layer deposition assembly includes: a deposition source for discharging a deposition material; a deposition source nozzle unit at a side of the deposition source and including a plurality of deposition source nozzles; a patterning slit sheet facing the deposition source nozzle unit and including a plurality of patterning slits disposed along one direction; a control sensor disposed in one side of the deposition source and for measuring a deposition rate of a deposition material evaporated from the deposition source; a monitoring sensor disposed in one side of the deposition source and for measuring the rate of the deposition material evaporated from the deposition source; and a sensor shutter for opening or closing a moving path of the deposition material evaporated from the deposition source to the monitoring sensor, wherein the transfer unit is configured to cyclically move between the first conveyer unit and the second conveyer unit, wherein the substrate fixed on the transfer unit is configured to be spaced apart from the organic layer deposition assembly by a set distance while being transferred by the first conveyer unit.

The monitoring sensor may measure the deposition rate of the deposition material during the movement of the substrate by the transfer unit, and an amount of the deposition material evaporated from the deposition source may be controlled using the measured deposition rate.

To deposit the deposition material on the substrate by a set target thickness, the deposition rate of the deposition source measured by the monitoring sensor may be controlled.

The deposition rate of the deposition source may be controlled by measuring a thickness of the deposition material deposited on the substrate, and the monitoring sensor may set a reference rate by measuring the deposition rate of the deposition source, and then intermittently confirm whether the deposition rate of the deposition source is the same as the reference rate.

The sensor shutter may open the moving path such that the deposition material arrives at the monitoring sensor only when the monitoring sensor measures the deposition rate of the deposition source.

The first conveyer unit and the second conveyer unit may be configured to pass through the deposition unit.

The first conveyer unit and the second conveyer unit may be respectively arranged above and below in parallel to each other.

The organic layer deposition apparatus may further include: a loading unit fixing the substrate on the transfer unit; and an unloading unit separating from the transfer unit the substrate on which the deposition has been completed while passing through the deposition unit.

The first conveyer unit may be configured to sequentially convey the transfer unit into the loading unit, the deposition unit, and the unloading unit.

The second conveyer unit may be configured to sequentially convey the transfer unit into the unloading unit, the deposition unit, and the loading unit.

The deposition source may be configured to discharge the deposition material to pass through the patterning slit sheet to be deposited on the substrate in a certain pattern.

The patterning slit sheet of the organic layer deposition assembly may be formed smaller than the substrate in at least any one of the first direction and a second direction perpendicular to the first direction.

A magnetic rail may be on a surface of the carrier, with each of the first conveyer unit and the second conveyer unit including a plurality of coils, wherein the magnetic rail and the plurality of coils are combined together to constitute an operation unit for generating a driving force to move the transfer unit.

The first conveyer unit includes guide members each including an accommodation groove, wherein the respective accommodation grooves are configured to accommodate both sides of the transfer unit, to guide the transfer unit to move in the first direction; and a magnetically suspended bearing is configured to suspend the transfer unit from the accommodation grooves so as to move the transfer unit in non-contact with the accommodation grooves.

The magnetically suspended bearing includes side magnetically suspended bearings arranged on both side surfaces of the carrier and upper magnetically suspended bearings arranged above the carrier.

The deposition source nozzle unit includes the plurality of deposition source nozzles along the first direction, the patterning slit sheet includes the plurality of patterning slits along the first direction, and the organic layer deposition apparatus further includes a shielding plate assembly disposed along the first direction between the deposition source nozzle unit and the patterning slit sheet and including a plurality of shielding plates for defining a space between the deposition source nozzle unit and the patterning slit sheet to a plurality of deposition spaces.

Each of the plurality of shielding plates may extend along a second direction perpendicular to the first direction.

The shielding plate assembly includes a first shielding plate assembly including a plurality of first shielding plates and a second shielding plate assembly including a plurality of second shielding plates.

Each of the plurality of first shielding plates and each of the plurality of second shielding plates may be formed in the second direction such as to define the space between the deposition source nozzle unit and the patterning slit sheet to the plurality of deposition spaces.

The deposition source nozzle unit includes a plurality of deposition source nozzles along the first direction, and the patterning slit sheet includes a plurality of patterning slits along a second direction perpendicular to the first direction.

Each of the plurality of deposition sources, the deposition source nozzle unit, and the patterning slit sheet may be integrally formed by being connected to each other via a connecting member.

The connecting member may guide a flow path of the deposition material.

The connecting member may be configured to seal a space between the patterning slit sheet and the plurality of deposition sources and the deposition source nozzle.

According to another embodiment of the present invention, there is provided a method of manufacturing an organic light-emitting display device by using an organic layer deposition apparatus for forming an organic layer on a substrate, the method including: conveying, into a chamber, a transfer unit on which the substrate is fixed, by using a first conveyer unit installed to pass through the chamber; forming an organic layer by depositing a deposition material discharged from an organic layer deposition assembly on the substrate while the substrate is configured to be moved relative to the organic layer deposition assembly with the organic layer deposition assembly in the chamber being spaced apart from the substrate by a set distance; and conveying the transfer unit from which the substrate is separated to the loading unit by using a second conveyer unit installed to pass through the chamber, wherein the forming of the organic layer includes: measuring a thickness of a deposition material deposited on the substrate; controlling an amount of a deposition material evaporated from a deposition source by controlling a deposition rate of the deposition material from the measured thickness of the deposition material and a target thickness; setting a reference rate by measuring the deposition rate of the deposition source in a monitoring sensor disposed at the deposition source; and confirming whether the deposition rate of the deposition source and the reference rate are identical to each other in the monitoring sensor.

The monitoring sensor may measure the deposition rate of the deposition material during the movement of the substrate by the transfer unit, and an amount of the deposition material evaporated from the deposition source may be controlled using the measured rate.

To deposit the deposition material on the substrate by a set target thickness, the deposition rate of the deposition source measured by the monitoring sensor may be controlled.

The confirming of whether the deposition rate of the deposition source and the reference rate may be identical to each other in the monitoring sensor is periodically performed.

The confirming of whether the deposition rate of the deposition source and the reference rate are identical to each other in the monitoring sensor may be performed when a moving path of the deposition material is opened such that the deposition material arrives at the monitoring sensor by using a sensor shutter.

The method may further include: before conveying the transfer unit by using the first conveyer unit, fixing the substrate on the transfer unit in a loading unit; before conveying the transfer unit by using the second conveyer unit, separating the substrate on which the depositing has been completed from the transfer unit in an unloading unit.

The transfer unit may be formed to cyclically move between the first conveyer unit and the second conveyer unit.

The first conveyer unit and the second conveyer unit may be respectively arranged above and below in parallel to each other.

The organic layer deposition assembly may include: a deposition source discharging a deposition material; a deposition source nozzle unit that is disposed at a side of the deposition source and includes a plurality of deposition source nozzles; and a patterning slit sheet facing the deposition source nozzle unit and including a plurality of patterning slits arranged along a second direction perpendicular to the first direction, wherein the deposition material discharged from the deposition source passes through the patterning slit sheet to be deposited on the substrate in a certain pattern.

The patterning slit sheet of the organic layer deposition assembly may be formed smaller than the substrate in at least any one of the first direction and the second direction.

According to another embodiment of the present invention, there is provided an organic light-emitting display device including: a substrate; a thin film transistor on the substrate and includes a semiconductor active layer, a gate electrode insulated from the semiconductor active layer, and source and drain electrodes each contacting the semiconductor active layer; a plurality of pixel electrodes on the thin film transistor; a plurality of organic layers on the plurality of the pixel electrodes; and a counter electrode disposed on the plurality of organic layers, wherein a length of a hypotenuse of at least one of the plurality of organic layers on the substrate farther from a center of a deposition region is larger than lengths of hypotenuses of those other organic layers formed closer to the center of the deposition region, and wherein the at least one of the plurality of organic layers on the substrate is a linearly-patterned organic layer formed using the organic layer deposition apparatus.

The substrate may have a size of 40 inches or more.

The plurality of organic layers may include at least an emission layer.

The plurality of organic layers may have a non-uniform thickness.

In each of the organic layers formed farther from the center of the deposition region, a hypotenuse farther from the center of the deposition region may be larger than the other hypotenuse.

The further one of the plurality of organic layers in the deposition region is from the center of the deposition region, the narrower an overlapped region of two sides of the one of the plurality of organic layers is formed.

Hypotenuses of the organic layer disposed at the center of the deposition region may have substantially the same length.

The plurality of organic layers in the deposition region may be symmetrically arranged about the center of the deposition region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
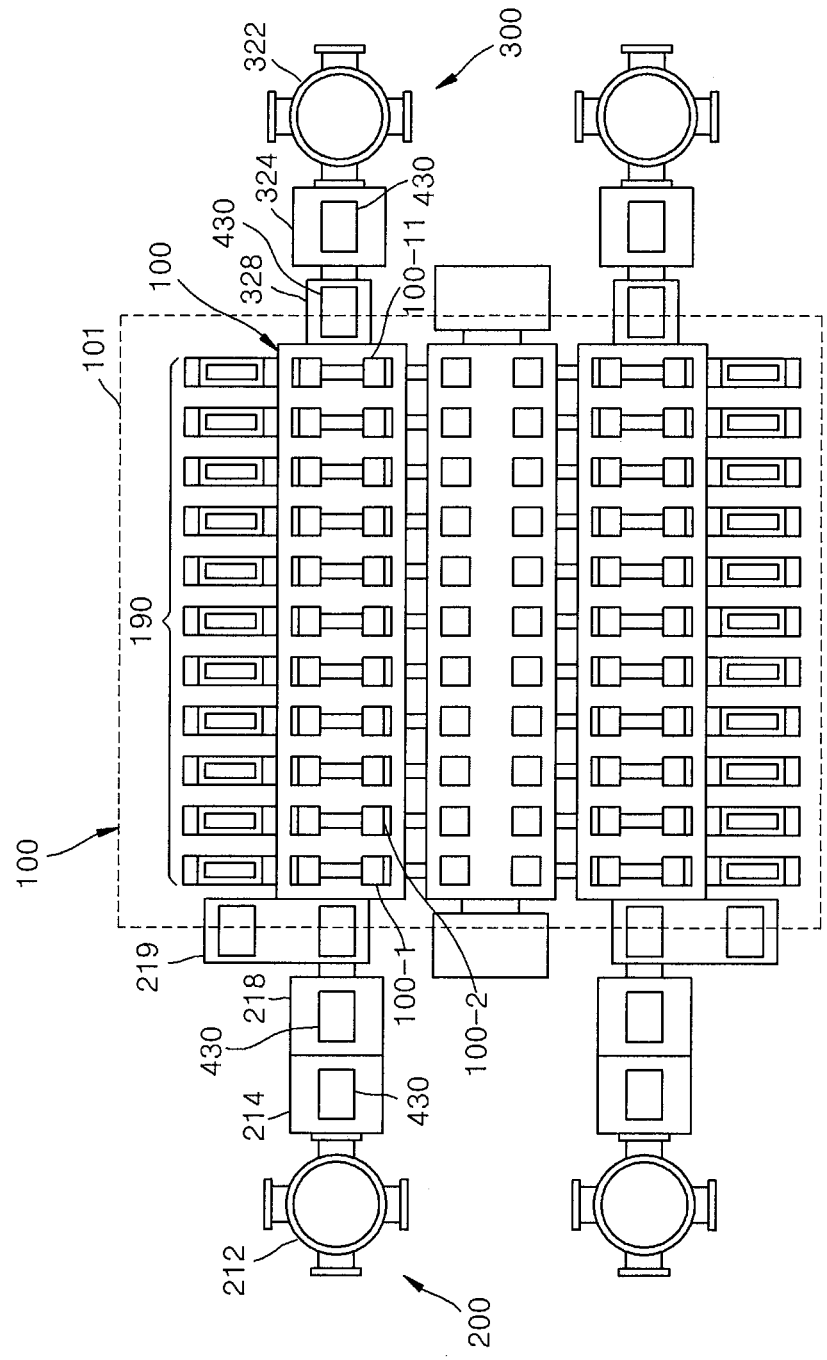
FIG. 1 is a schematic plan view illustrating a structure of an organic layer deposition apparatus according to an embodiment of the present invention.

Reference will now be made in more detail to the present embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
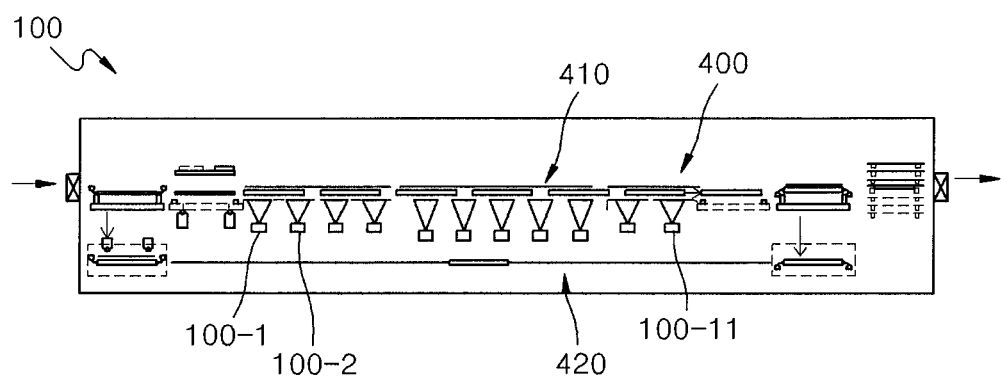
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100 (refer to FIG. 5).

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1) (100-2) . . . (100-n) may be disposed. Referring to FIG. 1, 11 organic layer deposition assemblies, i.e., a first organic layer deposition assembly (100-1), a second organic layer deposition assembly (100-2), . . . and an eleventh organic layer deposition assembly (100-11), are disposed in the chamber 101, but the number of organic layer deposition assemblies may vary with a desired deposition material and deposition conditions. The chamber 101 is maintained in a vacuum during the deposition process.

In the embodiment illustrated in FIG. 1, the transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the organic layer deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 disposed at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

Figure 3:
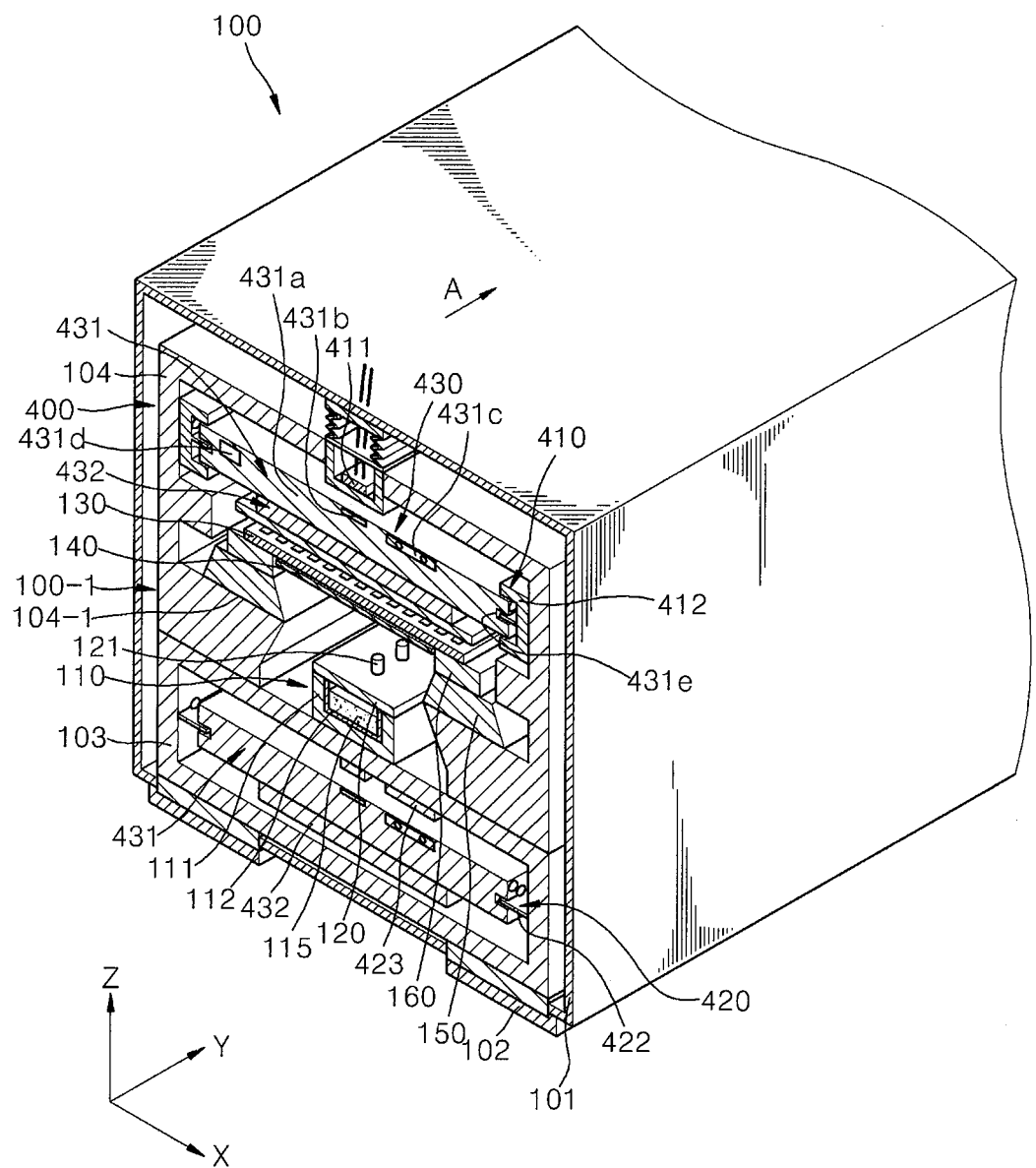
FIG. 3 is a schematic perspective view of the deposition unit of the organic layer deposition apparatus of FIG. 1, according to an embodiment of the present invention.
Figure 4:
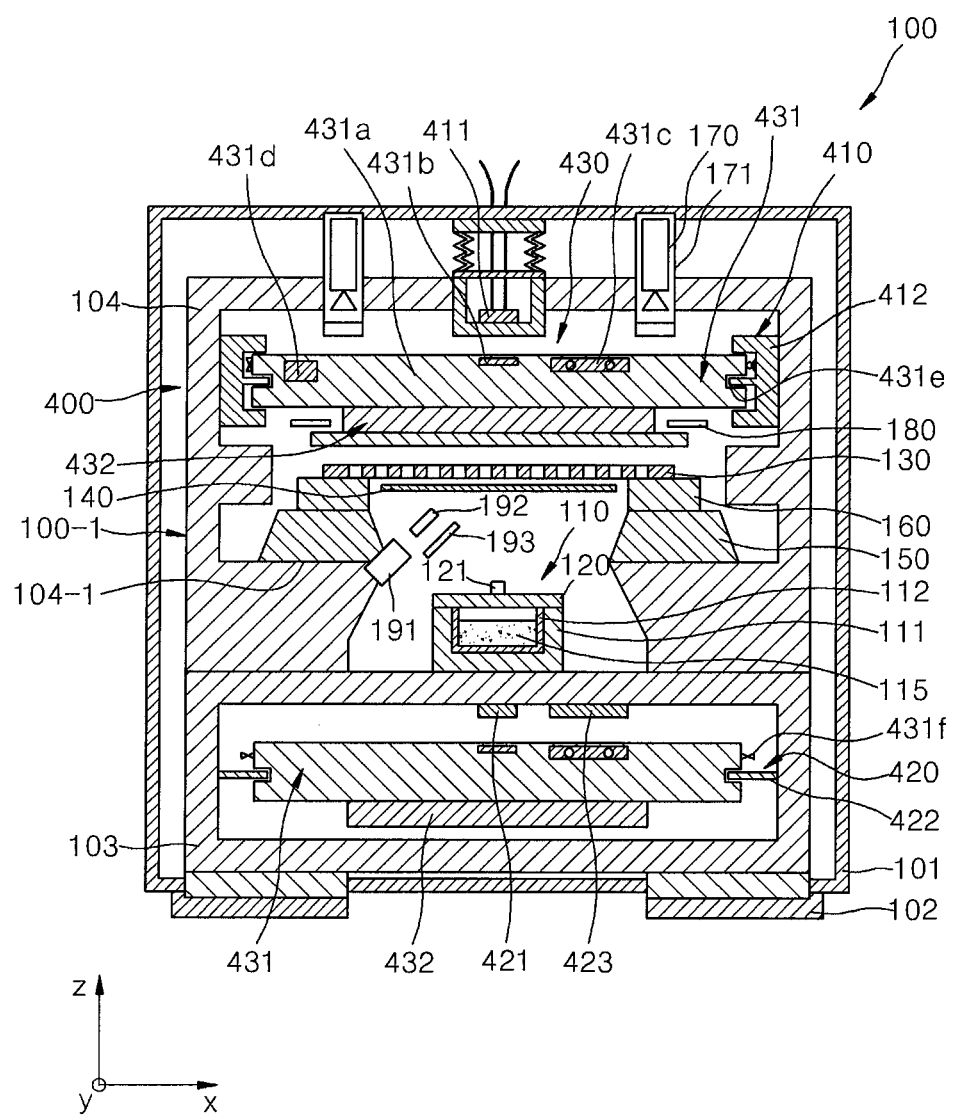
FIG. 4 is a schematic cross-sectional view of the deposition unit of FIG. 3, according to an embodiment of the present invention.
Figure 5:
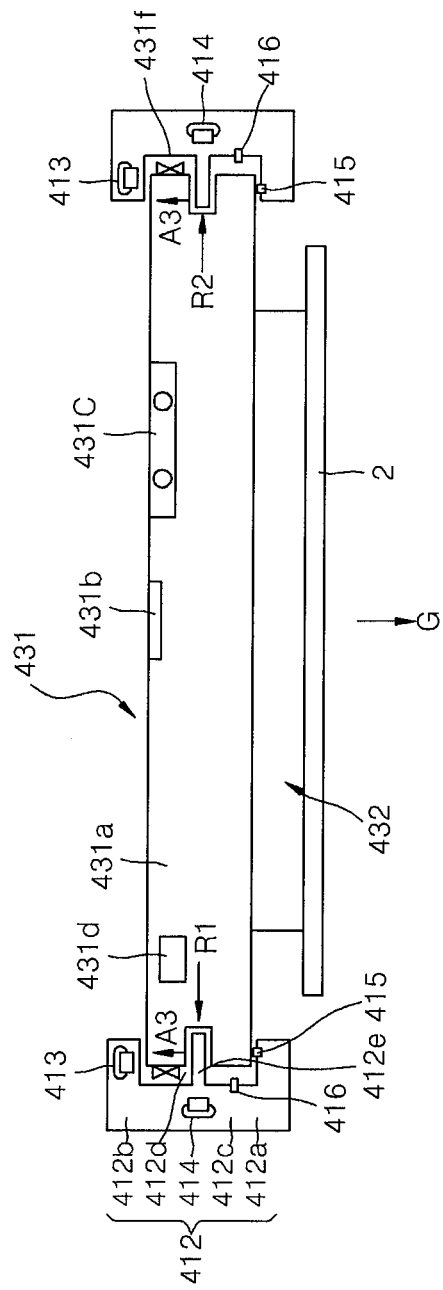
FIG. 5 is a cross-sectional view particularly illustrating a first conveyer unit and the transfer unit of the deposition unit of FIG. 3, according to an embodiment of the present invention.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. FIG. 5 is a perspective view of three deposition sources 110 of the deposition unit 100 of FIG. 3, according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 3 and 4 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of an FMM. In addition, the temperature of the patterning slit sheet 130 should be sufficiently lower than that of the deposition source 110 (about 100° C. or less) because thermal expansion of the patterning slit sheet 130 is minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to an embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120 is disposed in one side of the deposition source 110 facing the substrate 2. In this regard, the organic layer deposition assemblies according to the present embodiment may each include different deposition nozzles in performing deposition for forming common layers and pattern layers. Although not shown, a plurality of deposition source nozzles 121 may be formed in a deposition nozzle unit for forming pattern layers in an X-axial direction, i.e. along a scan direction of the substrate 2. Accordingly, the deposition source nozzles 121 are formed such that one deposition source nozzle 121 may be formed in a Y-axial direction, thereby greatly reducing an occurrence of a shadow. Also, the plurality of deposition source nozzles 121 may be formed in the deposition nozzle unit for forming common layers in the X-axial direction. Accordingly, thickness uniformity of common layers may be improved.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed in the same size. Accordingly, the mask needs to be large as the size of a display device increases. However, it is difficult to form a large mask.

To address these problems, in the organic layer deposition assembly 100-1 according to the present embodiment, the patterning slit sheet 130 is formed spaced apart by a certain distance from the substrate 2 on which a deposition material is to be deposited.

According to the present embodiment, deposition may be performed while a mask formed smaller than a substrate is moved with respect to the substrate, and thus, it is easy to manufacture the mask. In addition, defects due to contact between the substrate and the mask may be prevented. In addition, since it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be disposed between the patterning slit sheet 130 and the deposition source 110, to prevent the organic material from being deposited on the non-film-forming region of the substrate 2. Although not particularly illustrated in FIGS. 3 and 4, the shielding member 140 may include two adjacent plates. As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail. Referring to FIGS. 3 and 4, the conveyer unit 400 includes the first conveyer unit 410, the second conveyer unit 420, and the transfer unit 430.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

The carrier 431 of the transfer unit 430 will now be described in more detail.

The carrier 431 includes a main body part 431a, a linear motor system (LMS) magnet 431b, contactless power supply (CPS) modules 431c, a power supply unit 431d, and guide grooves 431e. The carrier 431 may further include cam followers 431f.

The main body part 431a constitutes a base part of the carrier 431 and may be formed of a magnetic material such as iron. In this regard, due to a repulsive force between the main body part 431a and the respective upper and side magnetically suspended bearings 413 and 414, which are described below, the carrier 431 may be maintained spaced apart from the guide members 412 by a certain distance.

The guide grooves 431e may be respectively formed at both sides of the main body part 431a and each may accommodate a guide protrusion 412e of the guide member 412.

The magnetic rail 431b may be formed along a center line of the main body part 431a in a direction where the main body part 431a proceeds. The LMS magnet 431b and the coil 411, which are described below in more detail, may be combined with each other to constitute a linear motor, and the carrier 431 may be conveyed in an arrow A direction by the linear motor.

The CPS modules 431c and the power supply unit 431d may be respectively formed on both sides of the LMS magnet 431b in the main body part 431a. The power supply unit 431d includes a battery (e.g. a rechargeable battery) that provides power so that the electrostatic chuck 432 can chuck the substrate 2 and maintains operation. The CPS modules 431c are wireless charging modules that charge the power supply unit 431d. In particular, the charging track 423 formed in the second conveyer unit 420, which is described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The LMS magnet 431b of the main body part 431a and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the LMS magnet 431b. The LMS magnet 431b is linearly disposed on the carrier 431, and a plurality of the coils 411 may be disposed at an inner side of the chamber 101 by a certain distance so as to face the LMS magnet 431b. Since the LMS magnet 431b is disposed on the carrier 431 instead of the coil 411, the carrier 431 may be operable without power being supplied thereto. In this regard, the coil 411 is included in an atmosphere (ATM) box in an air atmosphere, and the carrier 431 to which the LMS magnet 431b is attached may be moved in the chamber 101 maintained in a vacuum.

Hereinafter, the first conveyer unit 410 and the transfer unit 430 are described in more detail.

Referring to FIGS. 4 and 5, the first conveyer unit 410 conveys the electrostatic chuck 432 that fixes the substrate 2 and conveys the carrier 431 that conveys the electrostatic chuck 432. In this regard, the first conveyer unit 410 includes the coil 411, the guide members 412, the upper magnetically suspended bearings 413, the side magnetically suspended bearings 414, and the gap sensors 415 and 416.

The coil 411 and the guide members 412 are formed inside the upper housing 104. The coil 411 is formed in an upper portion of the upper housing 104, and the guide members 421 are respectively formed on both inner sides of the upper housing 104. The coil 411 is described below with reference to FIG. 9.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of arrow A illustrated in FIG. 3. In this regard, the guide member 412 may include a first accommodation part 412a disposed below the carrier 431, a second accommodation part 412b disposed above the carrier 431, and a connection part 412c that connects the first accommodation part 412a and the second accommodation part 412b. An accommodation groove 412d is formed by the first accommodation part 412a, the second accommodation part 412b, and the connection part 412c. Both sides of the carrier 431 are respectively accommodated in the accommodation grooves 412d, and the carrier 431 is moved along the accommodation grooves 412d.

The side magnetically suspended bearings 414 are each disposed in the connection part 412c of the guide member 412 so as to respectively correspond to both sides of the carrier 431. The side magnetically suspended bearings 414 cause a distance between the carrier 431 and the guide member 412 so that the carrier 431 is moved along the guide members 412 in non-contact with the guide members 412. That is, a repulsive force R1 occurring between the side magnetically suspended bearing 414 on the left side in FIG. 8 and the carrier 431, which is a magnetic material, and a repulsive force R2 occurring between the side magnetically suspended bearing 414 on the right side in FIG. 8 and the carrier 431, which is a magnetic material, maintain equilibrium, and thus, there is a constant distance between the carrier 431 and the respective parts of the guide member 412.

Each upper magnetically suspended bearing 413 may be disposed in the second accommodation part 412b so as to be above the carrier 431. The upper magnetically suspended bearings 413 enable the carrier 431 to be moved along the guide members 412 in non-contact with the first and second accommodation parts 412a and 412b and with a distance therebetween maintained constant. That is, an attractive force A3 occurring between the upper magnetically suspended bearing 413 and the carrier 431, which is a magnetic material, and gravity G maintain equilibrium, and thus, there is a constant distance between the carrier 431 and the respective parts 412a and 412b of the guide members 412.

Figure 8:
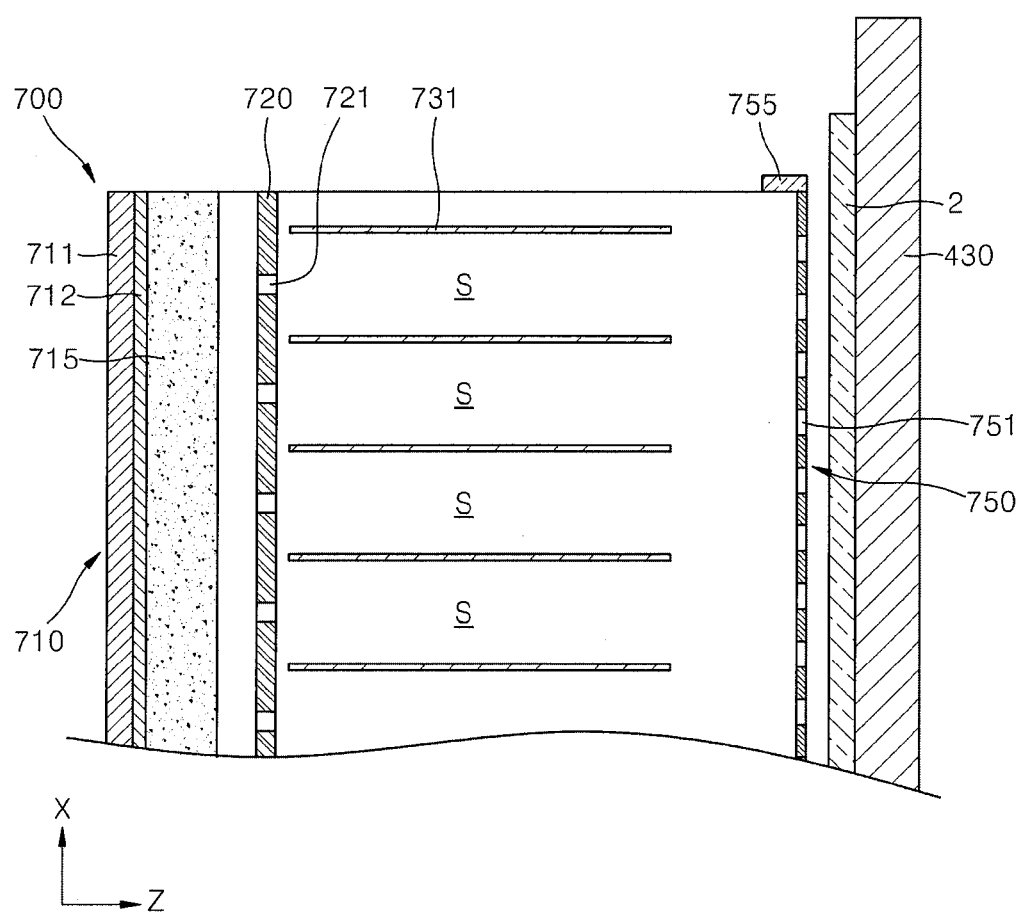
FIG. 8 is a plan cross-sectional view of the organic layer deposition assembly of FIG. 6, according to an embodiment of the present invention.

Each guide member 412 may further include the gap sensor 415. The gap sensor 415 may measure a distance between the carrier 431 and the guide member 412. Referring to FIG. 8, the gap sensor 415 may be disposed in the first accommodation part 412a so as to correspond to a bottom portion of the carrier 431. The gap sensor 415 disposed in the first accommodation part 412a may measure a distance between the first accommodation part 412a and the carrier 431. The gap sensor 416 may be disposed at a side of the side magnetically suspended bearing 414. The gap sensor 416 may measure a distance between a side surface of the carrier 431 and the side magnetically suspended bearing 414. The present invention is not limited to the above example, and the gap sensor 416 may be disposed in the connection part 412c.

Magnetic forces of the upper and side magnetically suspended bearings 413 and 414 may vary according to values measured by the gap sensors 415 and 146, and thus, distances between the carrier 431 and the respective guide members 412 may be adjusted in real time. That is, a precise transfer of the carrier 431 may be feedback controlled using the upper and side magnetically suspended bearings 413 and 414 and the gap sensors 415 and 416.

Hereinafter, the second conveyer unit 420 and the transfer unit 430 are described in more detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Although not illustrated in FIG. 4, the coil 421 may be disposed in an ATM box, as the coil 411 of the first conveyer unit 410.

Like the first conveyer unit 410, the second conveyer unit 410 may include the coil 421. Also, the LMS magnet 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100. In particular, the roller guides 422 support cam followers 431f respectively formed on both sides of the carrier 431 to guide the carrier 431 to move along a direction opposite to the direction of arrow A illustrated in FIG. 3. That is, the carrier 431 is moved with the cam followers 431f disposed on both sides of the carrier 431 respectively rotating along the roller guides 422. In this regard, the cam followers 431f utilized as bearings used to accurately repeat a particular operation. In an embodiment, a plurality of the cam followers 431f are formed on a side surface of the carrier 431 and serve as a wheel for conveying the carrier 431 in the second conveyer unit 420. A detailed description of the cam followers 431f is not provided herein.

The second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated in FIG. 4, the magnetic suspension may also be applied to the second conveyer unit 420 as in the first conveyer unit 410.

The organic layer deposition assembly 100-1 of the organic layer deposition apparatus 1 according to the present embodiment may further include the camera 170 and the sensor 180 for an aligning process.

The camera 170 may align in real time a first alignment mark (not shown) formed in the frame 135 of the patterning slit sheet 130 and a second alignment mark (not shown) formed on the substrate 2. Here, the sensor 180 may be a confocal sensor. Since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

Also, the organic layer deposition assembly 100-1 of the organic layer deposition apparatus 1 according to the present embodiment may further include a control sensor 191, a correction sensor 192, and a sensor shutter 193 for controlling a thickness of an organic substance film-formed on the substrate 2. This will be described in more detail below.

In more detail, a characteristic of an organic light-emitting diode (OLED) depends on the thickness of the film-forming organic substance to a considerable extent. Thus, to manufacture an organic light-emitting display apparatus of excellent quality, a tooling operation of correcting thicknesses of all film-forming organic substances are essentially required before film-forming is performed. In this regard, the tooling operation is a process of performing deposition on a substrate on which a device (for example, a TFT) is not deposited at a uniform rate with respect to a film-forming organic substance, measuring a thickness of the deposited substrate on which the organic substance is deposited by using an analysis device for measuring the thickness such as an ellipsometer, and changing a tooling factor (T/F) of the organic substance by using the measured thickness or adjusting the rate to a desired target thickness. In this regard, the T/F refers to a control parameter in a tooling process based on a ratio of a thickness of an organic substance measured by a real sensor and a target thickness of the organic substance.

However, if such a conventional tooling operation is performed on the organic substance film-formed on the substrate, the tooling operation must be performed for each type of an organic substance to be film-formed, for each deposition source, or for each assembly, and thus it takes a very long time to perform the tooling operation. For example, since the organic layer deposition apparatus 1 of FIG. 1 includes a total number of 11 organic layer deposition assemblies each including three deposition sources, to perform the tooling operation on each of the three deposition sources, a total number of 33 tooling operations must be performed. Moreover, since an organic substance is film-formed on a glass substrate and then analyzed, investment in a substrate material, a material consumed in and an analysis device used in deposition needs to be made. On the above grounds, the conventional tooling operation causes a reduction in production efficiency and an increase in material cost and investment costs.

To solve these problems, the organic layer deposition apparatus 1 according to the present embodiment further includes the control sensor 191, the correction sensor 192, and the sensor shutter 193 for controlling the thickness of the organic substance film-formed on the substrate 2, and monitors and corrects the film-forming thickness of the organic substance in real time.

In more detail, the control sensor 191 is disposed at one side of the deposition source 110. Such a control sensor 191 may be disposed in a region that does not interfere with a deposition path of the organic substance film-formed on the substrate 2, and may be disposed in one side of the deposition source 110.

Also, the correction sensor 192 (monitoring sensor 192 & reference sensor 192) for controlling the film-forming thickness of the organic substance in real time is disposed at one side of the control sensor 191. Such a correction sensor 192 may also be disposed in the region that does not interfere with the deposition path of the organic substance film-formed on the substrate 2, and may be disposed in one side of the deposition source 110.

The sensor shutter 193 is further disposed at one side of the correction sensor 192, in more detail, facing the deposition source 110 from the correction sensor 192. The sensor shutter 193 may be movably formed with respect to the correction sensor 192 and function to open or close a path through which a deposition material evaporated from the deposition source 110 moves to the correction sensor 192.

As a result, as shown in FIG. 4, one or more sensors having no location error are further installed above the control sensor 191 used for film-forming and are used as the correction sensor 192. In this regard, one or more sensors having no location error may be used as the correction sensor 192, and the sensor shutter 193 is installed in the front of the correction sensor 192 such that the correction sensor 192 may be used only for monitoring. In this regard, although the correction sensor 192 may be installed in a top portion of the control sensor 191 for control, the correction sensor 191 may be installed in another suitable portion, for example, in the transfer unit 430.

A method of correcting a thickness of the organic layer deposition apparatus 1 according to the present embodiment will now be described in more detail below.

A conventional thickness correction method is as follows. Film-forming is performed on each deposition glass substrate by using a T/F and a deposition rate (a rate) of organic substances used for film-forming. Thereafter, a thickness of the film-formed glass substrate is measured using an analysis device for analyzing the thickness such as an ellipsometer. In this regard, the measured thickness is used to adjust the T/F and satisfy a target thickness. To determine whether the corrected T/F value is exact, a confirmation operation needs to be performed on each organic substance again, and after a film-forming is performed on a device, the tooling process should be performed once after a deposition of 100~120 sheets.

Also, the method of correcting the thickness of the organic layer deposition apparatus 1 according to the present embodiment is very simple and does not need to perform an additional confirmation film-forming process. The method is as follows. In the same manner as in the conventional thickness correction method, film-forming is performed for each organic substance in an initial organic substance film-forming operation, and a thickness is confirmed using the analysis device such as the ellipsometer. Thereafter, a rate is confirmed by using the correction sensor 192 after a T/F is reflected to the deposition source 120 in which each organic substance is received. The rate confirmed by the correction sensor 192 is a monitoring reference value during a subsequent film-forming operation.

This will be described in more detail.

The T/F that changes in real time may be obtained according to the following equation.

$$(\text{measured thickness of organic substance}/\text{target thickness of organic substance}) \times \text{first } T/F \text{ (given } T/F\text{)} = \text{second } T/F \text{ (new } T/F\text{)}$$

For example, it is assumed that an initial deposition rate (initial rate) measured by the control sensor 191 is 10 Å/sec, the first T/F is 100%, and the target thickness is 1000 Å.

Under the above condition, in a case where a thickness of an organic layer that is substantially film-formed on a substrate is 1100 Å, the second T/F is $(1100/1000) \times 100 = 110(\%)$, and a value measured by the correction sensor 192 after the new T/F is applied is changed to $(10 \text{ Å/sec}) \times 110\% = 11$ Å/sec.

Thereafter, to change the current deposition rate (current rate) of 11 Å/sec to 10 Å/sec, the organic layer deposition apparatus 1 reduces a temperature of the deposition source 110 and controls a rate value measured by the correction sensor 192 to 10 Å/sec. Such a process satisfies a target thickness required in the process.

Further, as described above, after film-forming is performed on the device and an organic layer deposition of about 100~120 sheets, no additional tooling process is performed, the correction sensor 192 measures the deposition thickness again by opening the sensor shutter 193, calculates and applies the new T/F, and thus the target thickness required in the process is satisfied again.

As described above, according to the present embodiment, a film-forming thickness may be monitored in real-time without an additional deposition, which reduces time compared to a case where the film-forming thickness is confirmed after a deposition, thereby increasing productivity, and investment costs are reduced due to a reduction in the substrate cost and a reduction in the number of analysis equipments, thereby reducing product cost. Therefore, mass production may be greatly improved.

Figure 6:
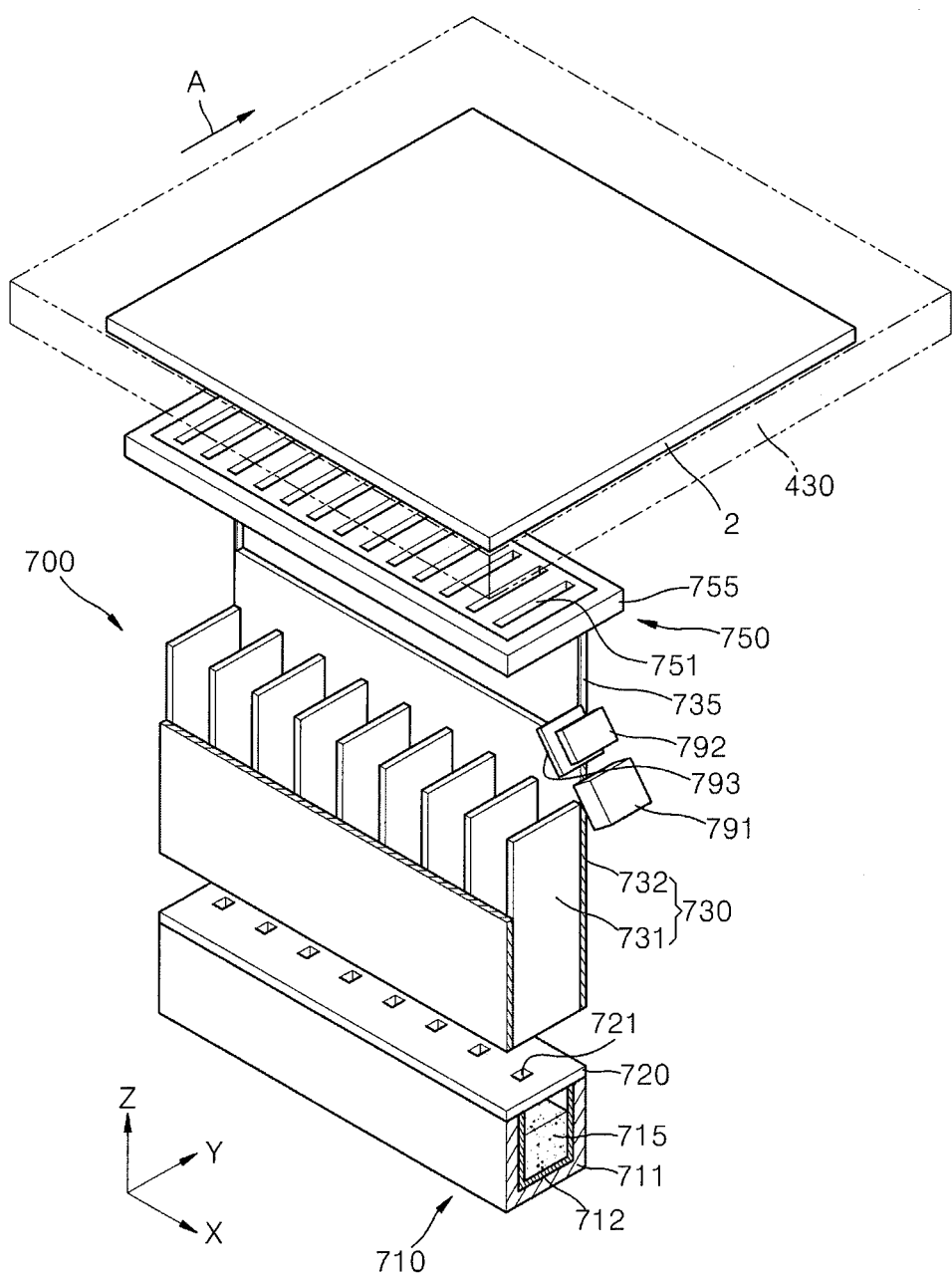
FIG. 6 is a schematic diagram of an organic layer deposition assembly, according to an embodiment of the present invention.
Figure 7:
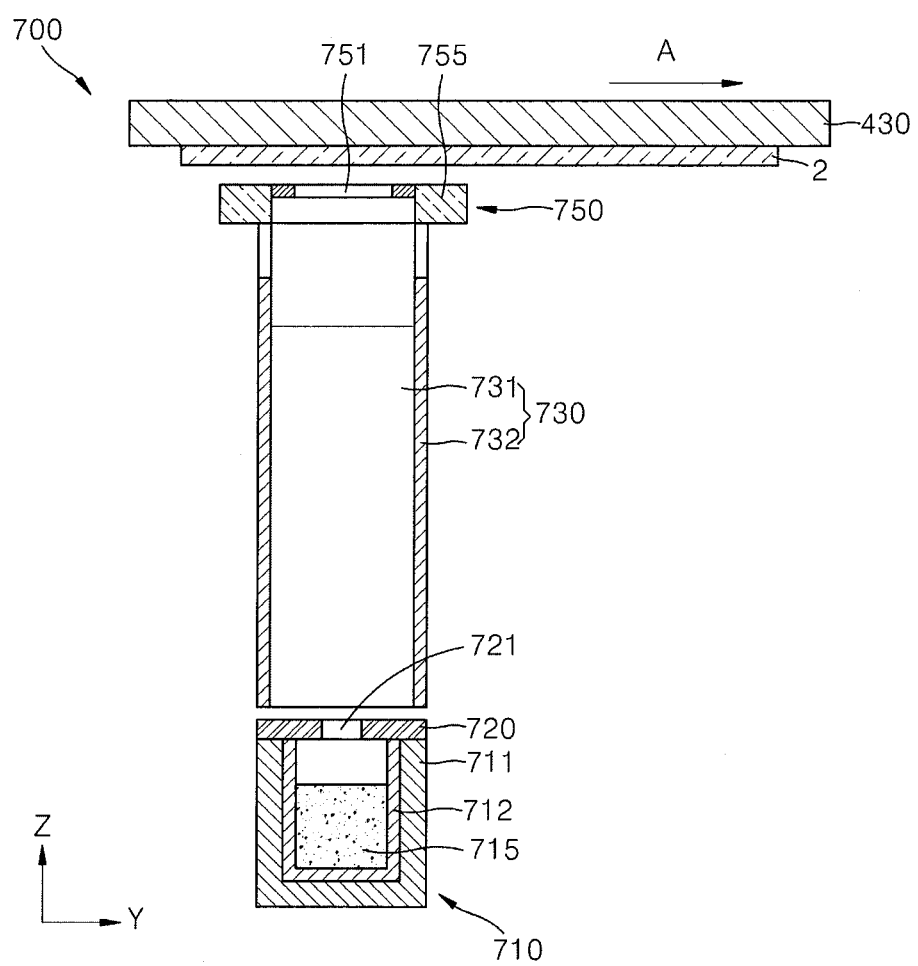
FIG. 7 is a side cross-sectional view of the organic layer deposition assembly of FIG. 6, according to an embodiment of the present invention.

FIG. 6 is a schematic diagram of an organic layer deposition assembly, according to an embodiment of the present invention. FIG. 7 is a side cross-sectional view of the organic layer deposition assembly of FIG. 6, according to an embodiment of the present invention. FIG. 8 is a plan cross-sectional view of the organic layer deposition assembly of FIG. 6, according to an embodiment of the present invention.

Referring to FIGS. 6 through 8, the organic layer deposition assembly 700 includes a deposition source 710, a deposition source nozzle unit 720, a shielding plate assembly 730, and a patterning slit sheet 750.

Here, the deposition source 710 includes a crucible 711 that is filled with a deposition material 715 and a heater 712 that heats the crucible 711 so as to vaporize the deposition material 715 toward a side of the deposition source nozzle unit 720.

Also, the deposition source nozzle unit 720 is disposed at one side of the deposition source 710, and includes a plurality of deposition source nozzles 721 along an X-axis direction.

The shielding plate assembly 730 is disposed at one side of the deposition source nozzle unit 720. The shielding plate assembly 730 includes a plurality of shielding plates 731 and a shielding plate frame 732 disposed outside the shielding plates 731. The shielding plates 731 may be disposed in parallel to each other along the X-axis direction. Here, the shielding plates 731 may be formed at equal intervals. Also, each of the shielding plates 731 may extend along a YZ plane in FIG. 6, and may have a rectangular shape. The shielding plates 731 disposed as such define a space between the deposition source nozzle unit 720 and the patterning slit sheet 750 into a plurality of deposition spaces S. In other words, the organic layer deposition assembly 700 is separated into the deposition spaces S according to the deposition source nozzles 721 each ejecting a deposition material, by the shielding plates 731, as shown in FIG. 8. As such, since the shielding plates 731 define the space between the deposition source nozzle unit 720 and the patterning slit sheet 750 into the plurality of deposition sources S, the deposition material discharged from one deposition source nozzle 721 is not mixed with the deposition materials discharged from other deposition source nozzles 721 and is deposited on the substrate 2 through a patterning slit 751. In other words, the shielding plates 731 guide flow paths of the deposition materials discharged through the deposition source nozzles 721 to flow straight in a Z-axis direction without being dispersed with each other.

As such, by obtaining linearity of the deposition materials by using the shielding plates 731, a size of a shadow formed on the substrate 2 may be significantly reduced, and thus it is possible to space the organic layer deposition assembly 700 and the substrate 2 from each other by a certain distance.

Also, the patterning slit sheet 750 is further disposed between the deposition source 710 and the substrate 2. The patterning slit sheet 750 includes a frame 755 having a shape of a window frame, and the patterning slit sheet 750 includes a plurality of the patterning slits 751 along the X-axis direction. The deposition material 715 vaporized in the deposition source 710 moves towards the substrate 2 through the deposition source nozzle unit 720 and the patterning slit sheet 750.

In addition and to control a thickness of an organic substance film-formed on the substrate 2, the organic layer deposition assembly 700 further includes a control sensor 791, a correction sensor 792, and a sensor shutter 793.

Figure 9:
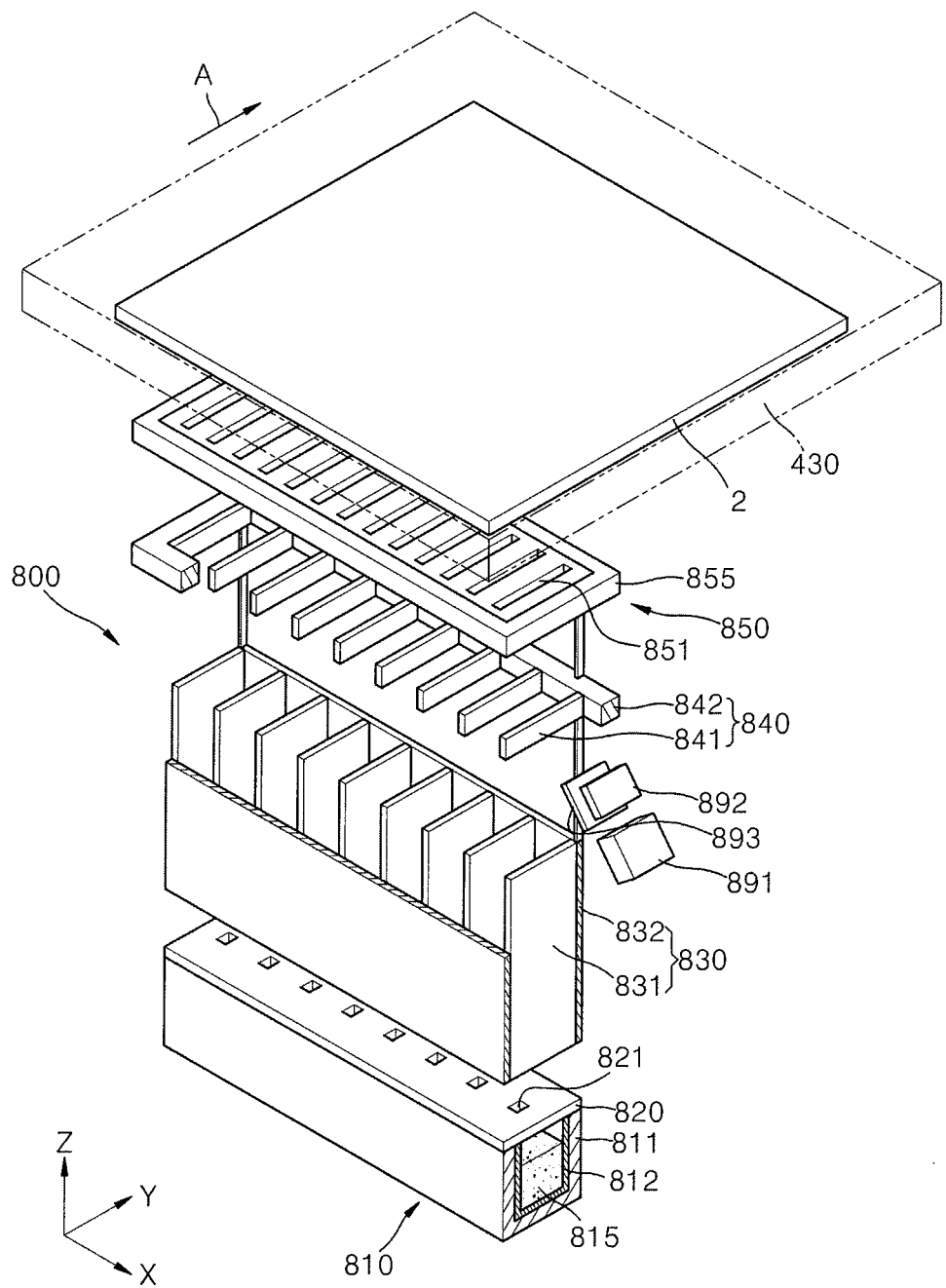
FIG. 9 is a schematic diagram of an organic layer deposition assembly, according to another embodiment of the present invention.

FIG. 9 is a schematic diagram of an organic layer deposition assembly 800, according to another embodiment of the present invention.

The organic layer deposition assembly 800 of FIG. 9 includes a deposition source 810, a deposition source nozzle unit 820, a first shielding plate assembly 830, a second shielding plate assembly 840, and a patterning slit sheet 850. Since detailed structures of the deposition source 810, the first shielding plate assembly 830, and the patterning slit sheet 850 are identical to those described above with reference to FIG. 6, descriptions thereof are not repeated. The current embodiment is different from previous embodiments since the second shielding plate assembly 840 is disposed at one side of the first shielding plate assembly 830.

In more detail, the second shielding plate assembly 840 includes a plurality of second shielding plates 841 and a second shielding plate frame 842 disposed outside the second shielding plates 841. The second shielding plates 841 may be parallel to each other along an X-axis direction at equal intervals. Also, each of the second shielding plates 841 may be parallel to a YZ plane in FIG. 11, i.e., perpendicular to the X-axis direction.

A plurality of first shielding plates 831 the plurality of second shielding plates 841 disposed as such define a space between the deposition source nozzle unit 820 and the patterning slit sheet 850. In other words, a deposition space is obtained according to deposition source nozzles 821 by the first and second shielding plates 831 and 841.

Figure 11:
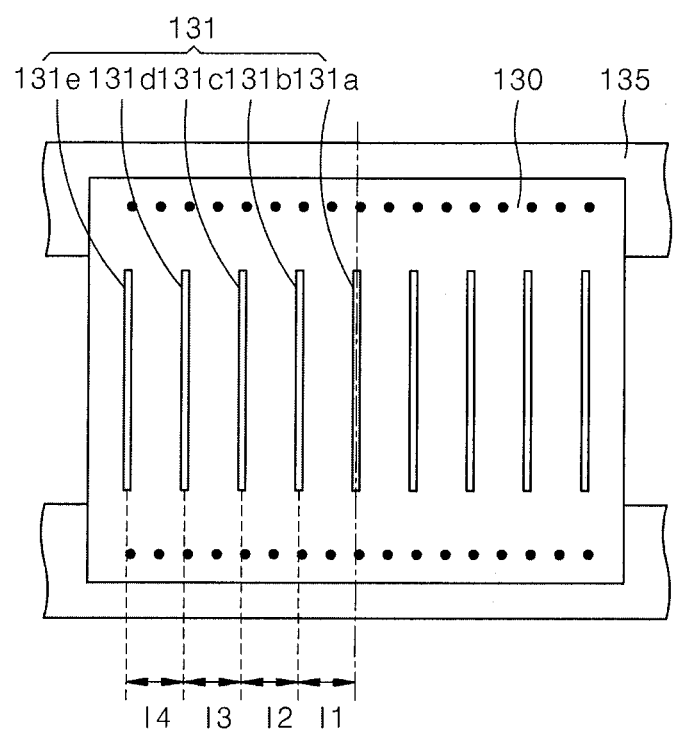
FIG. 11 is a diagram illustrating a structure in which patterning slits are arranged at equal intervals in a patterning slit sheet of the organic layer deposition apparatus including the deposition unit of FIG. 3, according to an embodiment of the present invention.

Here, the second shielding plates 841 and the first shielding plates 831 may be arranged in one-to-one correspondence. In other words, the second shielding plates 841 may be parallel to each other by being respectively aligned with the first shielding plates 831. In other words, the first and second shielding plates 831 and 841 are located on the same plane. In FIG. 11, the length of the first shielding plate 831 is equal to the width of the second shielding plate 841 in the X-axis direction, but the present invention is not limited thereto. In other words, the second shielding plate 841 that requires precise alignment with a patterning slit 851 is formed relatively thin whereas the first shielding plate 831 that does not require precise alignment is formed relatively thick, and thus it may be easy to manufacture the organic layer deposition assembly 800.

In addition and to control a thickness of an organic substance film-formed on the substrate 2, the organic layer deposition assembly 800 further includes a control sensor 891, a correction sensor 892, and a sensor shutter 893.

Figure 10:
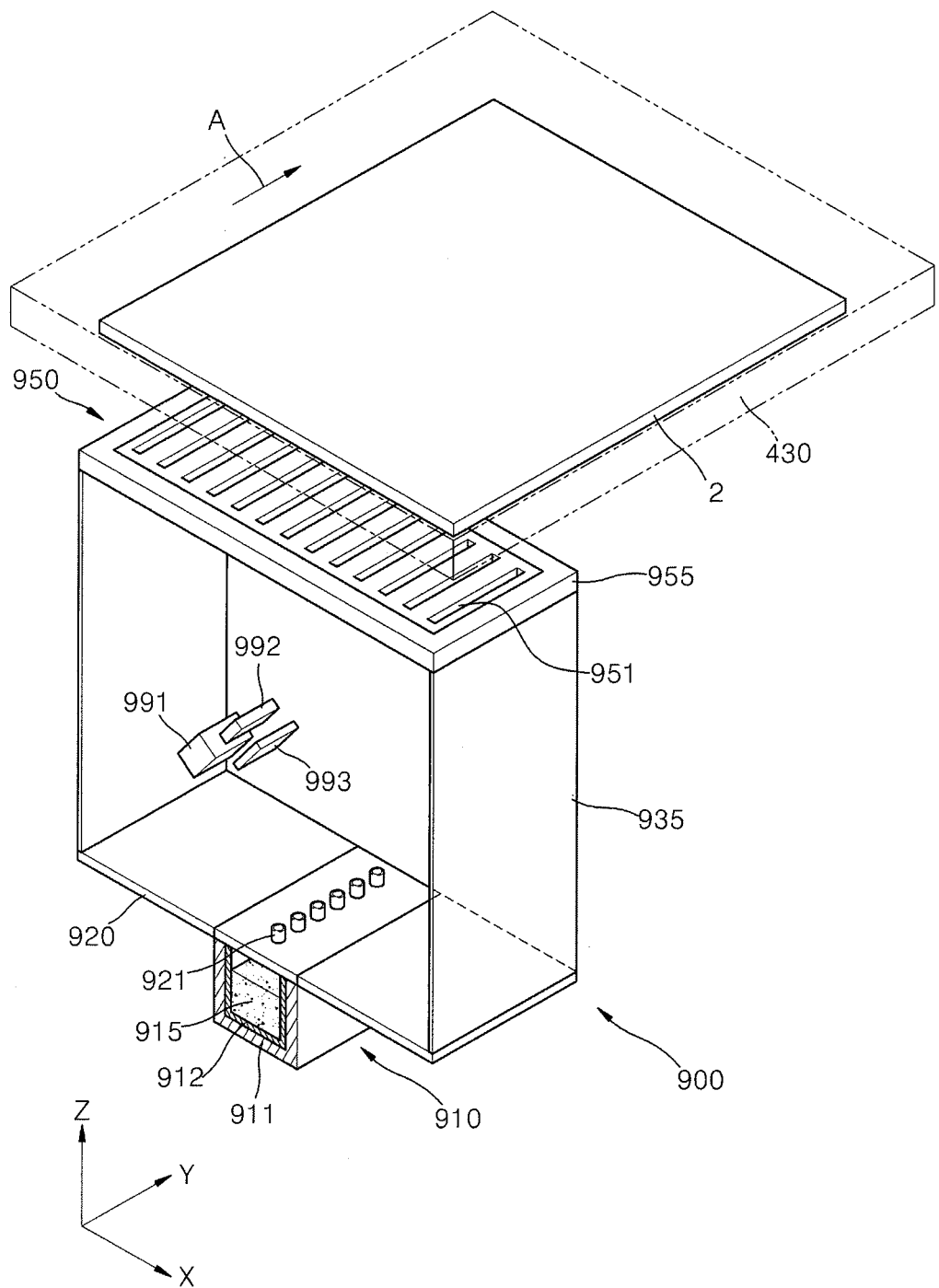
FIG. 10 is a schematic diagram of an organic layer deposition assembly, according to another embodiment of the present invention.

FIG. 10 is a schematic diagram of an organic layer deposition assembly 900, according to another embodiment of the present invention.

Referring to FIG. 10, the organic layer deposition assembly 900 includes a deposition source 910, a deposition source nozzle unit 920, and a patterning slit sheet 950.

Here, the deposition source 910 includes a crucible 911 that is filled with a deposition material 915 therein, and a heater 912 for vaporizing the deposition material 915 towards the deposition source nozzle unit 920 by heating the crucible 911. The deposition source nozzle unit 920 is disposed at one side of the deposition source 910, and includes a plurality of deposition source nozzles 921 along a Y-axis direction. The patterning slit sheet 950 and a frame 955 are disposed between the deposition source 910 and the substrate 2, and the patterning slit sheet 950 includes pluralities of patterning slits 951 and spacers 952 along the X-axis direction. Also, the deposition source 910 and the deposition source nozzle unit 920 are combined to the patterning slit sheet 950 by a connecting member 935.

The current embodiment is different from the previous embodiments since the arrangement of the deposition source nozzles 921 included in the deposition source nozzle unit 920 is different as described in more detail below.

The deposition source nozzle unit 920 is disposed at one side of the deposition source 910, in more detail, a side of the deposition source 910 facing the substrate 2. Also, the deposition source nozzle unit 920 includes the plurality of deposition source nozzles 921 along the Y-axis direction i.e., a scanning direction of the substrate 2. The deposition source nozzles 921 may be formed at equal intervals. The deposition material 915 vaporized in the deposition source 910 moves towards the substrate 2 through such a deposition source nozzle unit 920. Consequently, the plurality of deposition source nozzles 921 are formed in one organic layer deposition assembly 900 along the scanning direction of the substrate 2. Here, when the plurality of deposition source nozzles 921 are included in the X-axis direction, distances between the deposition source nozzles 921 and the patterning slit 951 are different from each other, and at this time, a shadow is formed by a deposition material discharged from the deposition source nozzle 921 farthest from the patterning slit 951. Accordingly, the deposition source nozzle 921 may be configured to include only one deposition source nozzle 921 in the X-axis direction so as to reduce formation of a shadow. Also, since the plurality of deposition source nozzles 921 exist in the scanning direction, a flux difference between the deposition source nozzles 921 is offset, and thus deposition uniformity may be constantly maintained.

In addition and to control a thickness of an organic substance film-formed on the substrate 2, the organic layer deposition assembly 900 further includes a control sensor 991, a correction sensor 992, and a sensor shutter 993.

Hereinafter, a structure of an organic layer formed using the organic layer deposition apparatus 1 described above is described in more detail.

Figure 12:
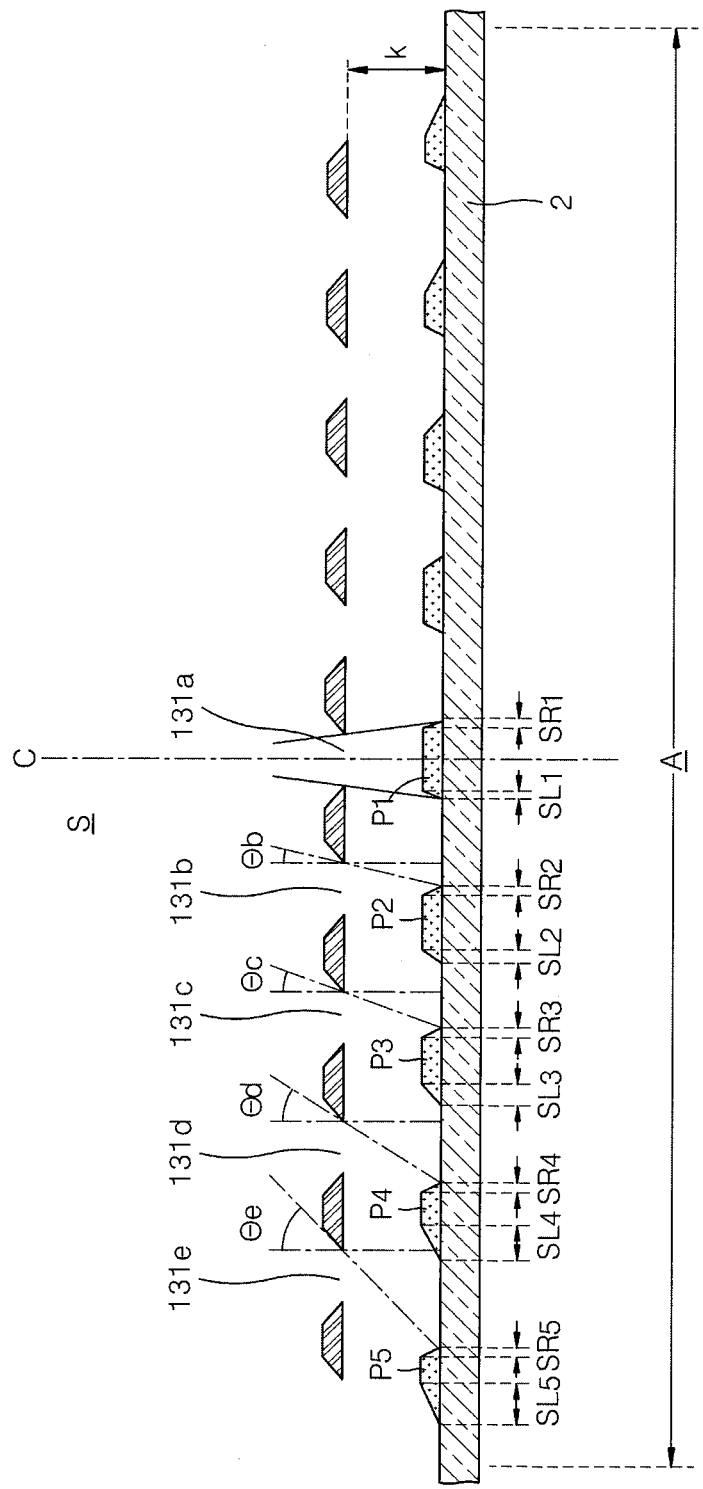
FIG. 12 is a diagram illustrating organic layers formed on a substrate by using the patterning slit sheet of FIG. 11, according to an embodiment of the present invention.

FIG. 11 is a diagram illustrating a structure in which the patterning slits 131 are arranged at equal intervals in the patterning slit sheet 130 of the organic layer deposition apparatus 1 including the deposition unit 100 of FIG. 3, according to an embodiment of the present invention. FIG. 12 is a diagram illustrating organic layers formed on the substrate 2 by using the patterning slit sheet 130 of FIG. 10, according to an embodiment of the present invention.

FIGS. 11 and 12 illustrate the patterning slit sheet 130 in which the patterning slits 131 are arranged at equal intervals. That is, in FIG. 11, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum size of a shadow, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 12, the organic layers formed on the left side of the center line C of the deposition space S have a structure in which a left hypotenuse is larger than a right hypotenuse, and the organic layers formed on the right side of the center line C of the deposition space S have a structure in which a right hypotenuse is larger than a left hypotenuse.

Also, in the organic layers formed on the left side of the center line C of the deposition space S, the length of the left hypotenuse increases towards the left. In the organic layers formed on the right side of the center line C of the deposition space S, the length of the right hypotenuse increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $θ_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $θ_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $e_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $θ_e$, and an organic layer $P_5$ formed using the deposition material that has passed through the patterning slit 131e has a left-side shadow having a size of $SL_5$.

In this regard, the critical incident angles satisfy the following condition: $θ_b<θ_c<θ_d<θ_e$, and thus, the sizes of the shadows of the organic layers also satisfy the following condition: $SL_1<SL_2<SL_3<SL_4<SL_5$.

Figure 13:
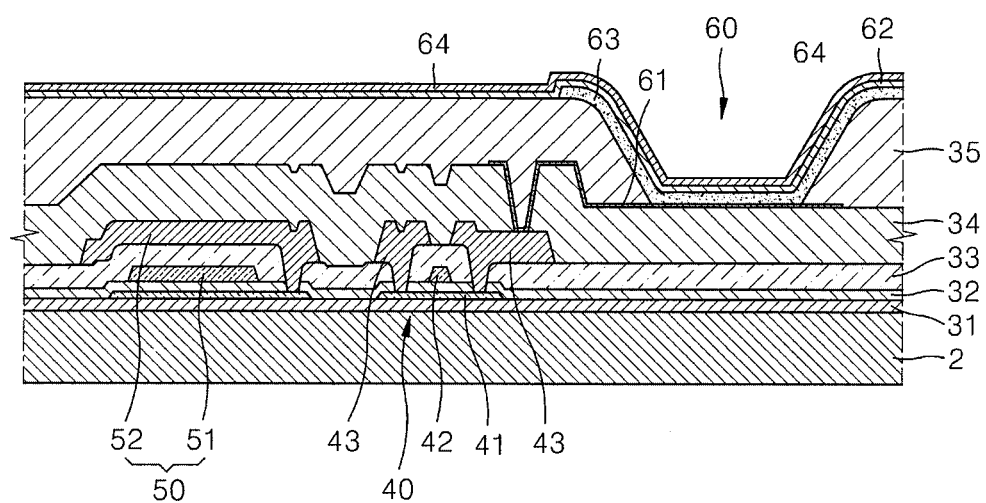
FIG. 13 is a cross-sectional view of an active matrix-type organic light-emitting display device manufactured using the organic layer deposition apparatus, according to an embodiment of the present invention.

FIG. 13 is a cross-sectional view of an active matrix-type organic light-emitting display device manufactured using the organic layer deposition apparatus 1, according to an embodiment of the present invention.

Referring to FIG. 13, the active matrix organic light-emitting display device 10 according to the current embodiment is formed on the substrate 50. The substrate 2 may be formed of a transparent material, for example, glass, plastic, or metal. An insulating layer 51, such as a buffer layer, is formed on an entire surface of the substrate 2.

A thin film transistor (TFT) 40, a capacitor 50, and an organic light-emitting diode (OLED) 60 are disposed on the insulating layer 31, as illustrated in FIG. 12.

A semiconductor active layer 41 is formed on an upper surface of the insulating layer 31 in a set or predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

Source/drain electrodes 43 are formed on the interlayer insulating layer 33 to contact the semiconductor active layer 41 through the contact hole. A passivation layer 34 is formed to cover the source/drain electrodes 43, and is etched to expose a part of one of the source/drain electrodes 43. An insulating layer (not shown) may be further formed on the passivation layer 34 so as to planarize the passivation layer 34.

In addition, the OLED 60 displays set or predetermined image information by emitting red, green, or blue light according to current. The OLED 60 includes a first electrode 61 disposed on the passivation layer 34. The first electrode 61 is electrically connected to the exposed source/drain electrode 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using the organic layer deposition apparatus 1 illustrated in FIGS. 1 through 11. That is, an organic layer deposition apparatus including a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein is disposed spaced apart by a set or predetermined distance from a substrate on which the deposition material is to be deposited. In addition, the deposition material discharged from the organic layer deposition apparatus 1 (refer to FIG. 1) is deposited on the substrate 2 (refer to FIG. 1) while the organic layer deposition apparatus 1 and the substrate 2 are moved relative to each other.

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

The organic layer deposition apparatuses according to the embodiments of the present invention described above may be applied to form an organic layer or an inorganic layer of an organic TFT, and to form layers from various materials.

As described above, the one or more embodiments of the present invention provide organic layer deposition apparatuses that are suitable for use in the mass production of a large substrate and enable high-definition patterning, methods of manufacturing organic light-emitting display devices by using the same, and organic light-emitting display devices manufactured using the methods.

Although a few embodiments of the present invention have been shown and described, it would be appreciated by those skilled in the art that changes may be made in this embodi-

What is claimed is:

1. A method of manufacturing an organic light-emitting display device by using an organic layer deposition apparatus for forming an organic layer on a substrate, the method comprising: conveying, into a chamber, a transfer unit on which the substrate is fixed, by using a first conveyer unit installed to pass through the chamber; forming an organic layer by depositing a deposition material discharged from an organic layer deposition assembly on the substrate while the substrate is configured to be moved relative to the organic layer deposition assembly with the organic layer deposition assembly in the chamber being spaced apart from the substrate by a set distance; and conveying the transfer unit from which the substrate is separated to a loading unit by using a second conveyer unit installed to pass through the chamber, wherein the forming of the organic layer comprises: measuring in real-time a thickness of a deposition material deposited on the substrate; controlling with a control sensor an amount of a deposition material evaporated from a deposition source by controlling a deposition rate of the deposition source from the measured thickness of the deposition material and a target thickness; setting a reference rate by measuring with a monitoring sensor the deposition rate of the deposition source onto the monitoring sensor at the deposition source; and confirming whether the deposition rate of the deposition source and the reference rate are identical to each other in the monitoring sensor.

2. The method of claim 1, wherein the monitoring sensor measures the deposition rate of the deposition material during the movement of the substrate by the transfer unit, and
an amount of the deposition material evaporated from the deposition source is controlled using the measured deposition rate.

3. The method of claim 2, wherein, to deposit the deposition material on the substrate by a set target thickness, the deposition rate of the deposition source measured by the monitoring sensor is controlled.

4. The method of claim 1, wherein the confirming of whether the deposition rate of the deposition source and the reference rate are identical to each other in the monitoring sensor is periodically performed.

5. The method of claim 1, wherein the confirming of whether the deposition rate of the deposition source and the reference rate are identical to each other in the monitoring sensor is performed when a moving path of the deposition material is opened such that the deposition material arrives at the monitoring sensor by using a sensor shutter.

6. The method of claim 1, further comprising:
before conveying the transfer unit by using the first conveyer unit, fixing the substrate on the transfer unit in the loading unit; and
before conveying the transfer unit by using the second conveyer unit, separating the substrate on which the depositing has been completed from the transfer unit in an unloading unit.

7. The method of claim 1, wherein the transfer unit is formed to cyclically move between the first conveyer unit and the second conveyer unit.

8. The method of claim 1, wherein the first conveyer unit and the second conveyer unit are respectively arranged above and below in parallel to each other.

9. The method of claim 1, wherein the organic layer deposition assembly comprises:
the deposition source discharging the deposition material;
a deposition source nozzle unit that is disposed at a side of the deposition source and comprises a plurality of deposition source nozzles; and
a patterning slit sheet facing the deposition source nozzle unit and comprising a plurality of patterning slits arranged along a second direction perpendicular to a first direction,
wherein the deposition material discharged from the deposition source passes through the patterning slit sheet to be deposited on the substrate in a certain pattern.

10. The method of claim 9, wherein the patterning slit sheet of the organic layer deposition assembly is formed smaller than the substrate in at least any one of the first direction and the second direction.

11. The method of claim 1, wherein the deposition rate of the deposition source is controlled by measuring a thickness of the deposition material deposited on the substrate,
the monitoring sensor is configured to set a reference rate by measuring the deposition rate of the deposition source, and then intermittently configured to confirm whether the deposition rate of the deposition source is the same as the reference rate.

12. The method of claim 1, wherein the first conveyer unit is configured to sequentially convey the transfer unit into the loading unit, a deposition unit, and an unloading unit.

13. The method of claim 1, wherein the second conveyer unit is configured to sequentially convey the transfer unit into an unloading unit, a deposition unit, and the loading unit.

14. The method of claim 1, wherein the deposition source is configured to discharge the deposition material to pass through a patterning slit sheet to be deposited on the substrate in a certain pattern.

15. The method of claim 1, wherein a magnetic rail is on a surface of a carrier, each of the first conveyer unit and the second conveyer unit comprises a plurality of coils, wherein the magnetic rail and the plurality of coils are combined together to constitute an operation unit for generating a driving force to move the transfer unit.

16. The method of claim 1, wherein a plurality of deposition source nozzles is formed along a first direction,
a patterning slit sheet comprising a plurality of patterning slits formed along the first direction, and
the organic layer deposition apparatus further comprises a shielding plate assembly disposed along the first direction between a deposition source nozzle unit and the patterning slit sheet and comprising a plurality of shielding plates for defining a plurality of deposition spaces between the deposition source nozzle unit and the patterning slit sheet.

17. The method of claim 1, wherein a plurality of deposition source nozzles is formed along a first direction, and
a plurality of patterning slits are deposed along a second direction perpendicular to the first direction.

* * * * *